United States Patent [19]
Hashizume et al.

[11] Patent Number: 5,150,044
[45] Date of Patent: Sep. 22, 1992

[54] SEMICONDUCTOR INTEGRATED CIRCUIT DEVICE COMPRISING SCAN PATHS HAVING INDIVIDUAL CONTROLLABLE BYPASSES

[75] Inventors: Takeshi Hashizume; Kazuhiro Sakashita, both of Hyogo, Japan

[73] Assignee: Mitsubishi Denki Kabushiki Kaisha, Tokyo, Japan

[21] Appl. No.: 673,822

[22] Filed: Mar. 22, 1991

[30] Foreign Application Priority Data

Mar. 29, 1990 [JP] Japan .................................. 2-86102
Feb. 20, 1991 [JP] Japan ................................ 3-024953

[51] Int. Cl.⁵ ..................................... G01R 31/28
[52] U.S. Cl. ............................. 324/158 R; 371/22.3
[58] Field of Search ............. 324/158 R, 158 T, 73.1; 371/22.1, 22.3, 22.5, 22.6, 25.1

[56] References Cited

U.S. PATENT DOCUMENTS 4,698,588 10/1987 Hwang et al. ................. 324/158 R
4,860,290 8/1989 Daniels et al. ..................... 371/22.3

FOREIGN PATENT DOCUMENTS 60-154173 8/1985 Japan .
1-112177 4/1989 Japan .

OTHER PUBLICATIONS

JTAG Boundary-Scan Architecture Standard Proposal, Version 2.0, 1988.
IEEE Standard Test Access Port and Boundary-Scan Architecture, 1990.
Standard Test Access Port and Boundary-Scan Architecture (Draft), Test Technology Technical Committee of the IEEE Computer Society, 1989.
The IEEE High Performance Systems publication entitled "1149.1, A Designer's Reference", Evanczuk, 1989, pp. 52-60.
The IEEE High Performance Systems publication entitled "Handling the Transition to Boundary Scan for Boards", Hansen et al., 1989, pp. 74-81.
The IEEE High Performance Systems publication entitled "Bringing 11.49.1 ito the Real World", McClean et al, 1989, pp. 61-70.
The VLSI Systems Design publication entitled "A CMOS Cell Library Design for Testability", Liu et al., 1987, pp. 58-65.
The VLSI Design publication entitled "Integrating the Approaches to Structured Design for Testability", Gutfreund, 1983, pp. 34-42.

Primary Examiner—Ernest F. Karlsen
Attorney, Agent, or Firm—Lowe, Price, LeBlanc & Becker

[57] ABSTRACT

Three shift path circuits (10', 20', 30') each comprising a bypass circuit are connected in series between a test data input (TDI) and a test data output (TDO). Each shift path circuit constitutes a design definition test data register connected to a circuit to be tested. Design modification of a testing circuit can be minimized by selectively operating the bypass circuit provided in a shift path circuit, even if there is circuit modification in the circuit to be tested. The period of time required for testing circuits to be tested is reduced.

12 Claims, 16 Drawing Sheets

SEMICONDUCTOR INTEGRATED CIRCUIT DEVICE COMPRISING SCAN PATHS HAVING INDIVIDUAL CONTROLLABLE BYPASSES

BACKGROUND OF THE INVENTION

Cross-References to Related Copending Application

Related and copending application of particular interest to the instant application is U.S. Ser. No. 628,688, entitled "A Scan Path System and An Integrated Circuit Device Using the Same", filed Dec. 14, 1990, and assigned to the same assignee of the instant application.

Field of the Invention

The invention relates generally to semiconductor integrated circuit devices, and more particularly, to a semiconductor integrated circuit device capable of complying with design modification of a circuit to be tested with minor design modification in a testing circuit. The present invention has particular applicability to a semiconductor integrated circuit device conforming to "IEEE Standard Test Access Port and Boundary-Scan Architecture" (IEEE Std. 1149.1-1990).

Description of the Background Art

Integration density of semiconductor integrated circuit devices has increased in accordance with recent advances in the miniaturization processing technology to result in larger scaled and more complex LSI internal circuits. This has led to a difficulty in that testing of all internal circuits in a LSI in accordance with a fault simulation could not be carried out in a short time. It has become essential for recent LSIs to incorporate testability in their designs. Particularly, for custom LSIs, such as cell-based designed LSIs called Application Specific Ics (ASIC), increased integration density is required, as well as reduction in both time for designing and the cost. That is to say, not only testability, but also facility and automation of test design are required.

Printed circuit boards (PCB) have the package density of the surface thereof increased according to the development of recent surface packaging techniques. This gave rise to the standardization of a testing method called "boundary-scan" by the IEEE (IEEE 1149.1) in order to adopt the scan testing method which was a conventional testability method within a LSI for PCB testing. The requirement of providing circuitry for PCB testing within a LSI is growing. The necessity of providing testing circuits easily designed for LSI internal testing and PCB testing for future ASICs has been pointed out.

The scan methodology is employed for testing circuits provided in a semiconductor integrated circuit. The serial scan method and the address scan method are two such known scanning methods. The serial scan method has a shift register provided in advance within a semiconductor integrated circuit, whereby the shift register is accessed from an external source prior to and after the testing. The access to the shift register allows the application of test data to a desired circuit to be tested within the semiconductor integrated circuit and/or application of data indicating the test result from the circuits to be tested to an external source.

It is generally necessary to carry out testing of a plurality of test patterns to determine whether the circuit to be tested is normal or not. In other words, a plurality of test data are repeatedly applied to a circuit to be tested to provide data indicating the test result therefrom. Diagnosis of the circuit to be tested is based on the test result. In the aforementioned serial scan method, the total time required for testing is increased with increases in the number of test data, i.e. the number of times of repeated testing increases, due to the input and output of test data carried out serially in response to a clock signal.

FIG. 9 is a block diagram of a testing circuit and circuits to be tested in a conventional semiconductor integrated circuit device. Referring to FIG. 9, a semiconductor device 200 comprises a testing circuit 51c for providing control signals necessary to carry out testing, and circuits-to-be-tested 202-207. Each of circuits-to-be-tested 202-207 is provided with shift registers 51-57 forming a scan path. Each of shift registers 52-57 applies test data transmitted via testing circuit 51c to each of circuits-to-be-tested 202-207, and/or provides the test results generated in each circuit-to-be-tested to an external source via testing circuit 51c. The application of test data to each of shift registers 52-57 and transmission of test results through testing circuit 51c are carried out via wirings connected to the input and output of each shift register. Accordingly, each of shift registers 52-57 is connected to testing circuit 51c through at least two wirings for data transmission. This results in wiring concentration such as those shown by wiring portions A and B of FIG. 9. It is noted that dedicated regions for these wirings are required.

An example of testing circuit 51c is shown in FIG. 10. The circuit of FIG. 10 is disclosed in Japanese Patent Laying-Open No. 1-112177. FIG. 10 shows the structure within testing circuit 51c of FIG. 9, with shift registers 90-99. Referring to FIG. 10, testing circuit 51c comprises a register 2 for holding a selecting signal SL of 3 bits to select shift registers 90-99, a decoder 4 for decoding the 3-bit selecting signal SL held in register 2, switching elements 61-67 connected to the outputs of decoder 4, and gates 81-87 for providing a clock signal to drive each of shift registers 90-99. Each of shift registers 90-99 is connected to the common test data input terminal Di. Each of AND gates 81-87 is connected to receive clock signal $\phi b$ and the output signal from decoder 4. Register 2 includes a 3-bit shift register for holding a shifted selecting signal SL in response to clock signal $\phi a$. Decoder 4 is enabled in response to signal EN to provide signals 001-110 for selectively turning on switching elements 61-67.

In operation, an external 3-bit selecting signal SL and a clock signal $\phi a$ are applied to register 2. Register 2 responds to clock signal 100 a to hold and provide a shifted selecting signal SL to decoder 4. Decoder 4 responds to an externally applied enable signal EN to decode the held selecting signal SL. The decoded signal is provided to AND gates 81-87. AND gates 81-87 provide a clock signal for driving only the shift register selected by selecting signal SL. Because output signals 001-110 decoded by decoder 4 are applied to switching elements 61-67, only the switching element connected to the output of the selected shift register is turned on. Therefore, a signal Do indicating the test result is provided only from the shift register specified by the selecting signal SL.

In general, a semiconductor integrated circuit device comprises circuit blocks having various functions. Circuit blocks are provided in functional units, where the testing of integrated circuits are often carried out by the circuit blocks and by functional units for simplifying creation of test data. Thus, as shown in FIG. 9, shift registers 52-57 are provided in each block used for testing circuit-to-be-tested blocks 202-207. The shift registers are divided by the circuit block unit due to testing carried out by circuit block unit to suppress the drawback of increase in testing time in the serial scan method.

As shown in FIG. 9, a testing circuit 51c is provided within a semiconductor device to test circuit-to-be-tested blocks 202-207. The number of circuit-to-be-tested blocks, i.e. the number of shift paths depends on the circuit configuration of the semiconductor chip. Therefore, the control system circuit and data input/output interface circuit of testing circuit block 51c vary in each semiconductor chip. This means that the design of testing circuit 51c must be modified for each semiconductor device. In other words, the numbers of switching elements 61-67 and gates 81-87 must be increased or decreased according to the increase or decrease of shift registers 90-99 of FIG. 10. There are some cases where the bit length of register 2 and decoder 4 must be modified due to increase in the shift registers to be used.

Because the circuit structure of testing circuit 51c should be designed depending o the individual semiconductor device or chip, the designer must implement various design modifications regarding testing circuit 51c in designing individual semiconductor devices. If a plurality of shift paths are provided within testing circuit 51c to comply with design modification for increase or decrease of the above mentioned shift paths, there will be unnecessary occupied area when the number of circuit blocks to be tested is low due to the existence of circuits not used. There is also a disadvantage that the region occupied by wiring is increased due to the need of many wirings for transmitting data signals, as shown in the wiring portions of A and B in FIG. 9. In other words, the necessary wiring region restricts the increase in integration density of the LSI device. It is also pointed out that the testing requires a long period of time when a plurality of shift paths is necessary to carry out testing for a circuit block (for example, when input data and output data are held in different shift paths).

FIG. 11 is a flow chart of a test operation by a conventional testing circuit using 3 shift registers. For the sake of simplicity, it is assumed that the 3 shift registers 91-93 of FIG. 10 are used, where the input test data of the circuit-to-be-tested is set in shift register 91, and the output data obtained by this application is captured by shift registers 92 and 93. It is also assumed that each of the shift registers have a bit length of L, M and N.

At step 41, a 3-bit selecting signal SL for selecting shift register 91 responds to clock signal $\phi a$ to be applied to register 2. A clock pulse of 3 periods is necessary for applying selecting signal SL. Decoder 4 decodes the applied selecting signal SL to activate only switching element 62 and AND gate 82.

At step 42, test data Di responds to clock signal $\phi b$ to be applied to shift register 91. A clock pulse of L periods equivalent to the bit length of shift register 91 is required to apply this test data.

At step 43, testing of the circuit-to-be-tested is carried out, where the test input data set in shift register 91 is applied to the circuit-to-be-tested. Therefore, the test output data indicating the testing result is applied and held in shift registers 92 and 93. It is assumed that a clock pulse of one period is required to carry out the testing.

At step 44, a selecting signal SL for selecting shift register 92 is applied to register 92. Decoder 4 decodes this selecting signal SL and activates only switching element 63 and gate 83. A clock pulse of 3 periods is required for applying this selecting signal SL.

At step 45, data Do indicating the test result within shift register 92 is provided via switching element 63. A clock pulse of M periods is required for the output of shift register 92.

At step 42, a selecting signal SL for selecting shift register 93 is applied to register 2. This requires a clock pulse of 3 periods. Decoder 4 activates only switching element 64 and AND gate 84.

At step 47, the data indicating the test result held in shift register 93 responds to clock signal $\phi b$ to be provided via switching element 64. This requires a clock pulse of N periods.

At steps 45 and 47, the test result data provided external to the integrated circuit device is analyzed along with an applied test data Di at an analysis step not shown to determine whether the circuit-to-be-tested is normal or not.

At step 48, determination is made whether the above operation has been completed for all test data (test patterns). If there are some prepared test data still remaining, the control is returned to step 41 to repeat a process similar to the aforementioned process. In the flow chart of FIG. 11, testing is carried out for 9 test data.

The total time TT1 required for testing all Q test data is expressed in the following equation from the above description.

$$TT1 = (10 + L + M + N) \times Q \tag{1}$$

It is appreciated that the necessary total time TT1 increases depending upon the bit lengths L, M, and N of the shift registers, and the total number Q of all the test patterns.

SUMMARY OF THE INVENTION

An object of the present invention is to reduce design modification of a testing circuit required in accordance with circuit modification of a circuit to be tested in an integrated circuit device.

Another object of the present invention is to reduce testing time of a circuit to be tested in an integrated circuit device.

A further object of the present invention is to reduce wiring density used for a circuit to be tested in an integrated circuit device.

Briefly stated, an integrated circuit device according to the present invention includes at least one shift register coupled between a single data input and a single data output, a plurality of circuits each to be tested, and a plurality of scan path circuits each connected to a corresponding circuit to be tested of the plurality of circuits for forming a scan path for the corresponding circuit to be tested. The plurality of scan path circuits are connected in series between the data input and the data output to implement a serial connection. The serial connection of the plurality of scan path circuits and at least one shift register are connected in parallel to each other. The integrated circuit device further includes a selective enable circuit responsive to an externally applied selecting signal for selectively enabling one of the serial connection of the plurality of scan path circuits and at least one shift register, a plurality of bypass circuits each bypassing a corresponding scan path circuit, and a bypass control circuit responsive to an externally applied bypass control signal for selectively operating a plurality of bypass circuits.

In operation, each of the plurality of scan path circuits for testing a plurality of circuits is provided with a plurality of bypass circuits for bypassing a corresponding scan path circuit. Because a bypass control circuit is responsive to an externally applied bypass control signal to selectively operate a plurality of bypass circuits, it is unnecessary to perform design modification of the selective enable circuit even if circuit modification is required in the plurality of circuits to be tested. In other words, because a plurality of bypass circuits is selectively operated by the bypass control circuit, a scan path circuit can be provided corresponding to the circuit modification occurring in the plurality of circuits to be tested. This eliminates the necessity of design modification in the testing circuit, i.e. the selective enable circuit.

According to another aspect of the present invention, an integrated circuit device includes a test data input for receiving test data, a test data output for providing test result data, first and second circuit blocks each to be tested, a first scan path circuit for writing or reading test data to or from the first circuit block, a second scan path circuit for writing or reading test data to or from the second circuit block, and a selective enable circuit responsive to an externally applied selecting signal for selectively enabling one of the first and second scan path circuits. The first and second scan path circuits are connected in parallel between the test data input and the test data output. The second scan path circuit includes n shift registers ($n \geq 2$) connected between the test data input and the test data output, and cascaded in n stages, and n bypass circuits each forming a bypass of a corresponding shift register. The integrated circuit device further includes a bypass control circuit responsive to an externally applied bypass control signal for selectively operating n bypass circuits.

In operation, n shift registers each having a bypass circuit is provided within the second scan path scan circuit for testing the second circuit block. Because the bypass control circuit is responsive to an externally applied bypass control signal for selectively operating n bypass circuits, the necessity of design modification of the testing circuitry, i.e. the selective enable circuit, is eliminated and can comply with circuit modification occurring in the second circuit block.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
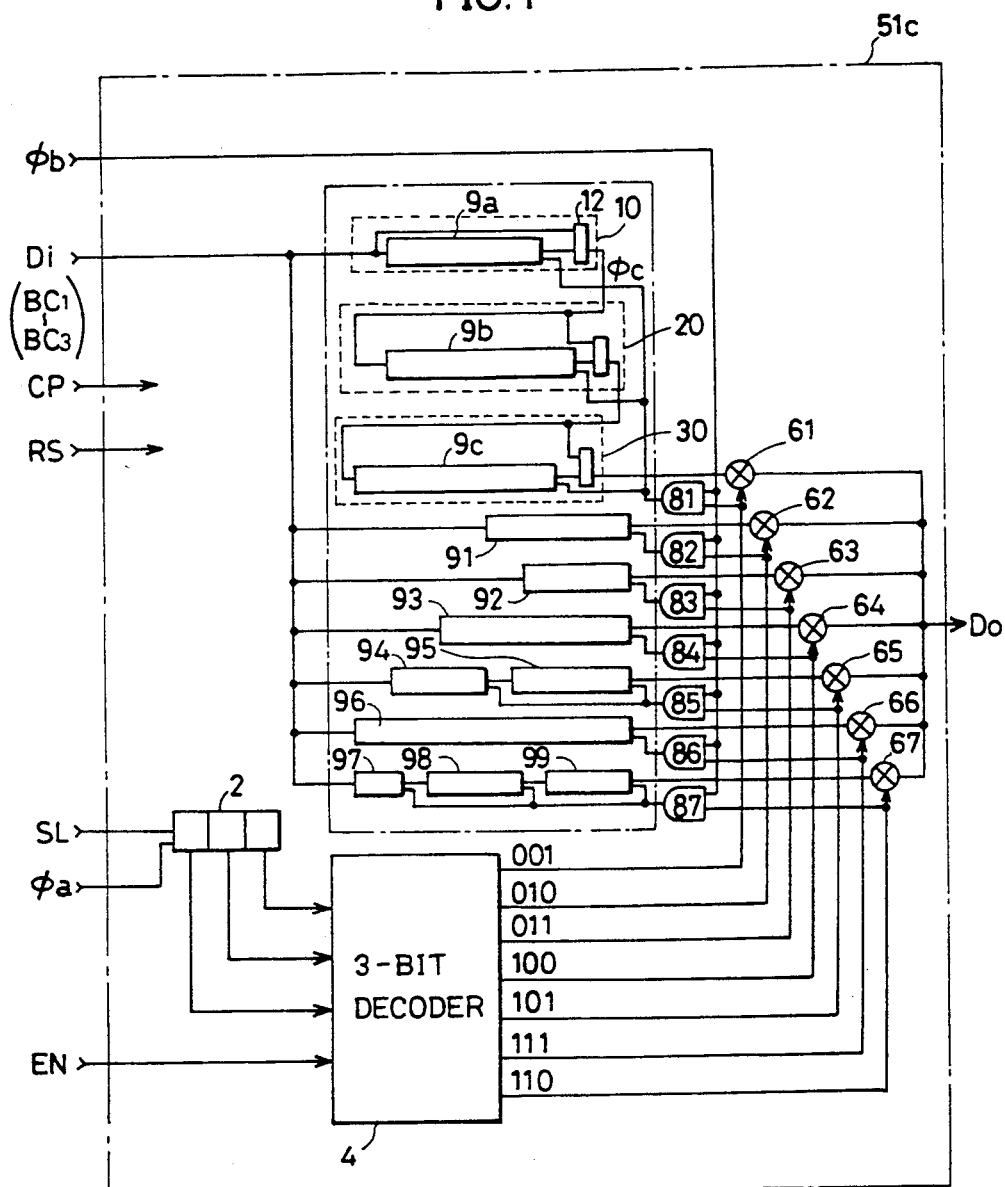
FIG. 1 is a circuit block diagram of an integrated circuit device of an embodiment of the present invention.
Figure 10:
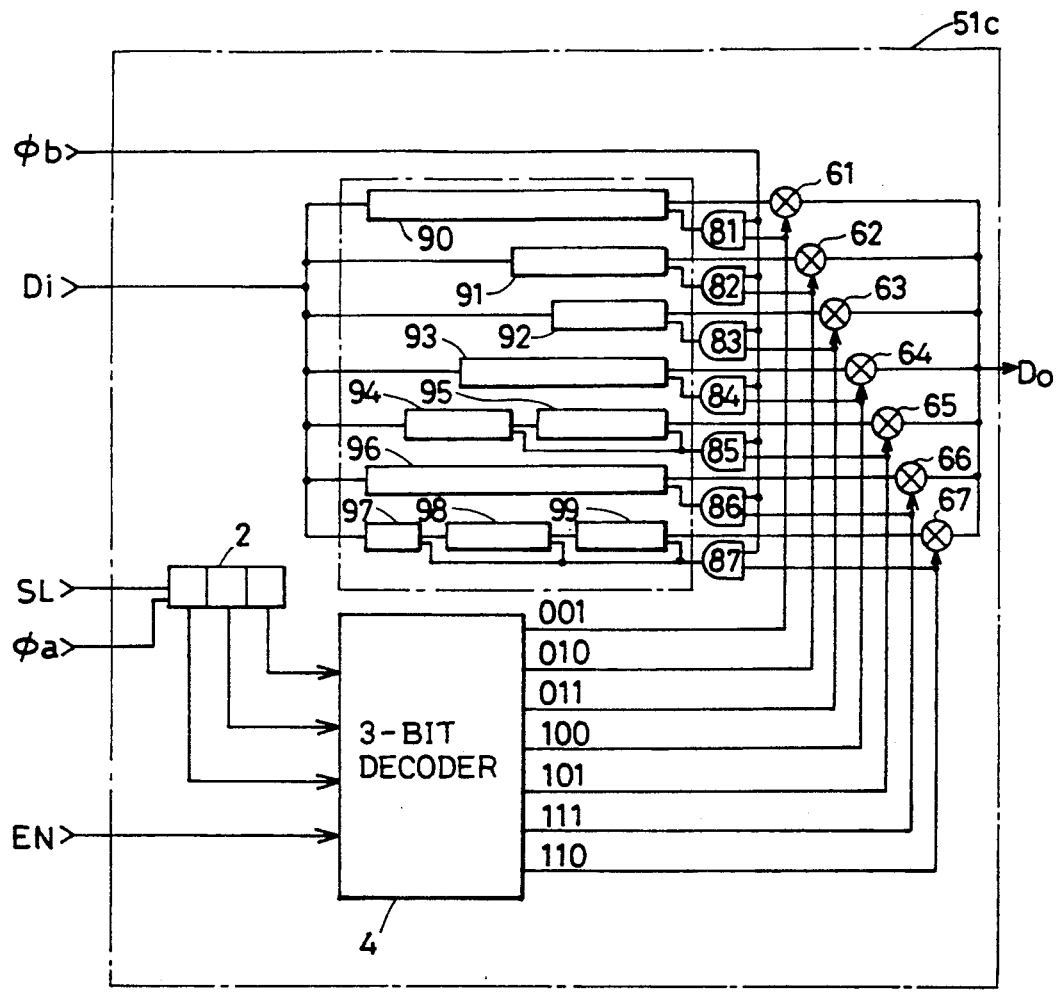
FIG. 10 is a circuit block diagram of a testing circuit of a conventional integrated circuit device.
Figure 11:
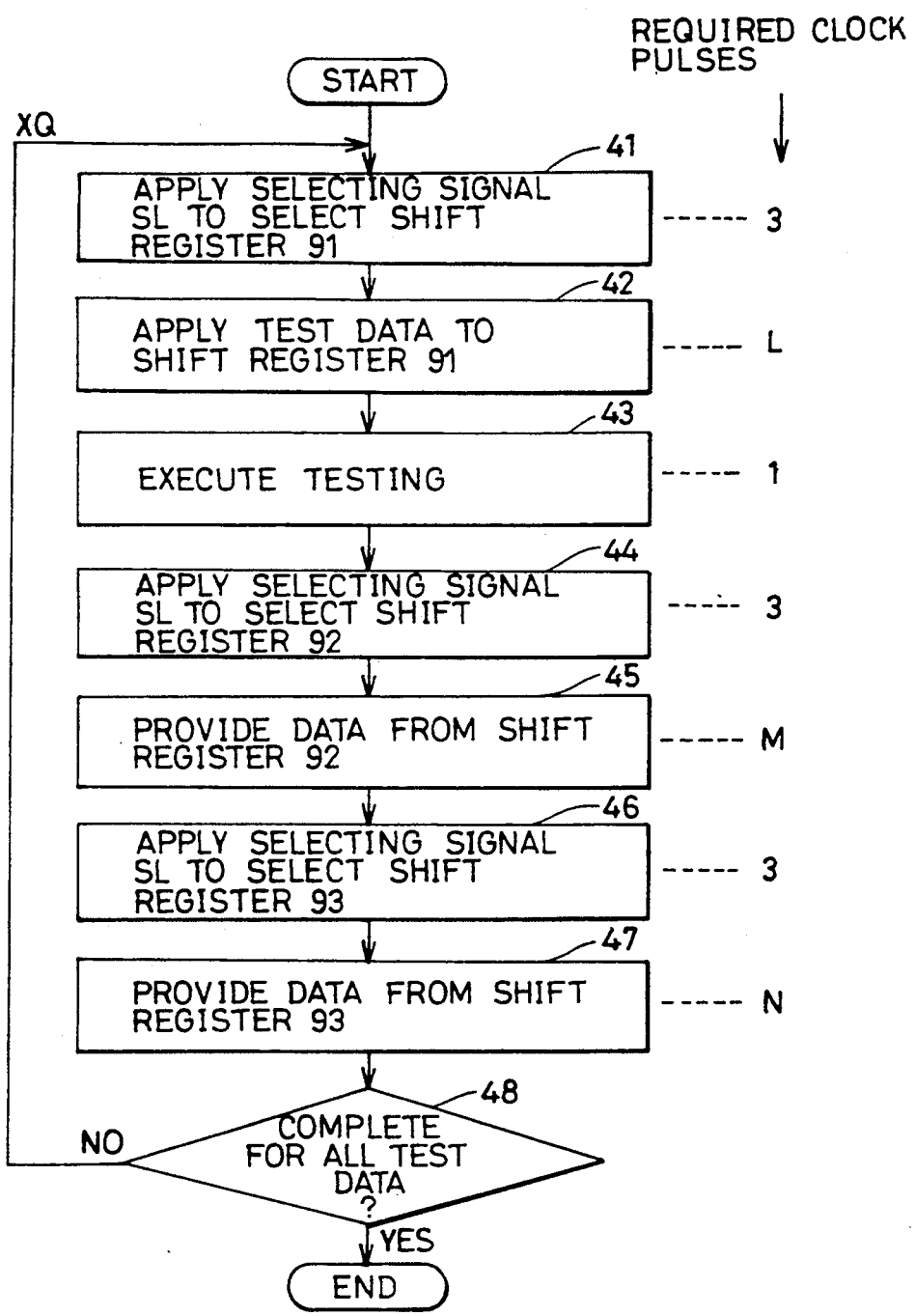
FIG. 11 is a flow chart of testing operation using the three shift registers of FIG. 10.

Referring to FIG. 1, three shift path circuits 10, 20, and 30 connected in series each having a bypass circuit are provided, instead of the one shift register 90 of FIG. 10. Also, control signals CP and RS are applied from external sources. The remaining circuit components are similar to those of FIG. 10, and the description thereof will not be repeated.

Figure 2:
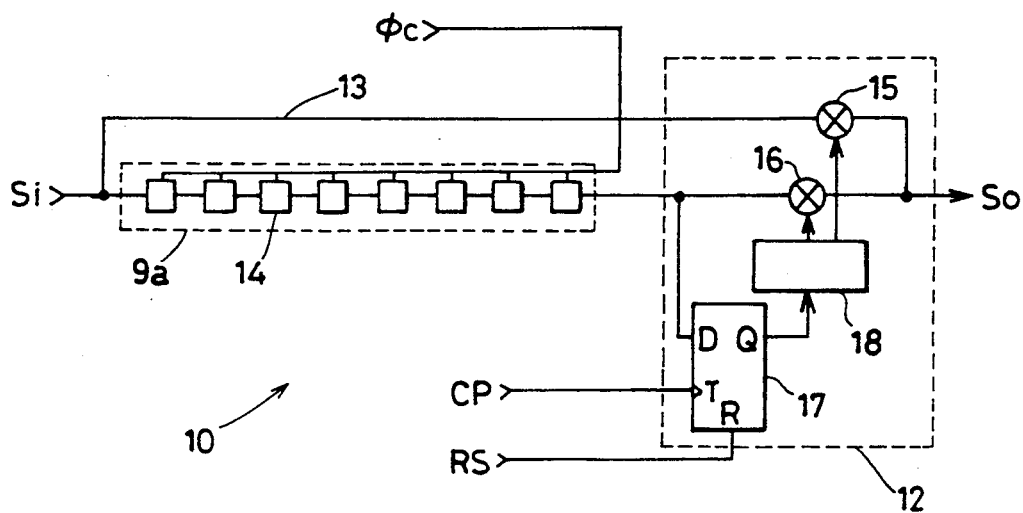
FIG. 2 is a circuit block diagram of a shift path circuit of FIG. 1.

A shift path circuit 10 having the bypass circuit of FIG. 1 is shown in FIG. 2. Shift path circuits 20 and 30 each having a bypass circuit have similar circuit configurations. Referring to FIG. 2, shift path circuit 10 comprises a shift register 9a having serially connected shift register latches (SRL) (14), a bypass line 13 for bypassing shift register 9a, and a selecting circuit 12 for selecting shift register 9a or bypass line 13. Shift register 9a is connected to a circuit-to-be-tested (not shown) and forms a scan path. Selecting circuit 12 comprises a latch circuit 17 connected to the output of shift register 9a, a 1-bit decoder 18 for decoding a latched signal, and switching elements 15 and 16 operating in response to the output signals from the decoder.

In operation, shift register 9a responds to clock signal $\phi c$ provided from AND gate 81 of FIG. 1 to shift the applied serial data (test data) Si. Latch circuit 17 is reset in advance by reset signal RS. Latch circuit 17 responds to an externally applied holding signal CP to hold one of input data Si provided from shift register 9a. The held signal is decoded by decoder 18 to selectively turn on either of switching elements 15 or 16. This causes the applied serial data Si to be provided as serial output data So through either of shift register 9a and switching element 16 or bypass line 13 and switching element 15. Because the three shift path circuits 10, 20 and 30 are connected in series, the provision of clock signal can be controlled by one AND gate 81. Also, the output can be controlled by one switching element 61. Although 3 shift path circuits 10, 20 and 30 are provided in the example of FIG. 1, the number of shift path circuits connected in series and their bit lengths depends on the circuits to be tested specific to the semiconductor integrated circuit device. The other shift registers 91-99 are connected to a circuit used in common to the semiconductor integrated circuit device, whereby there is no need for design modification of the testing circuit. In the testing using shift path circuits 10, 20 and 30, each of shift registers 9a, 9b and 9c is bypassed by bypass line 13 in accordance with the testing. Therefore, only the shift register required for testing can be used.

Because the shift path circuit (for example, 10, 20 and 30) required for testing the circuit portion specific to the semiconductor integrated circuit device are provided instead of one scan path (for example, the shift register 90 of FIG. 10), design modification required for the testing circuit is minimized. This means that the circuit portion common to the semiconductor integrated circuit device can be used without design modification in the testing circuit.

Figure 4:
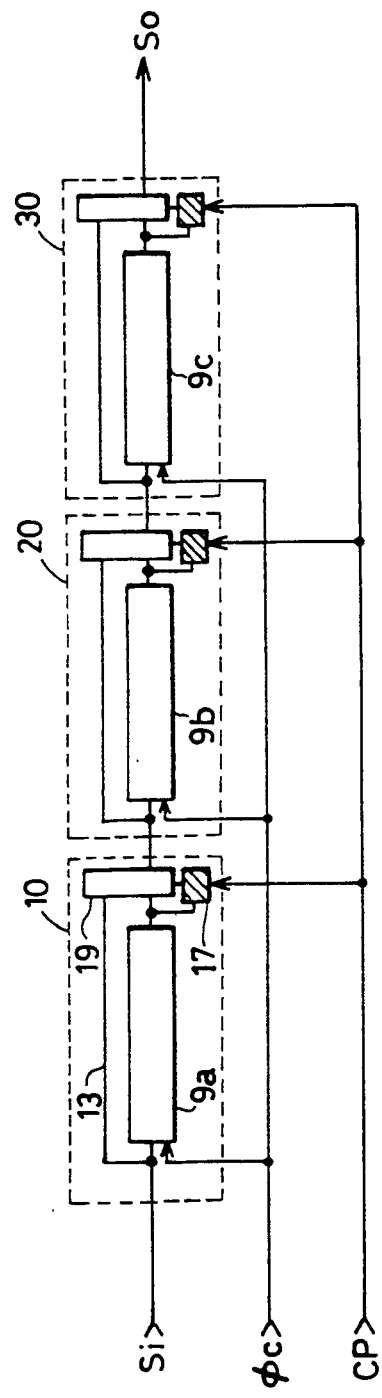
FIG. 4 is a circuit block diagram of the three shift path circuits of FIG. 1.
Figure 5:
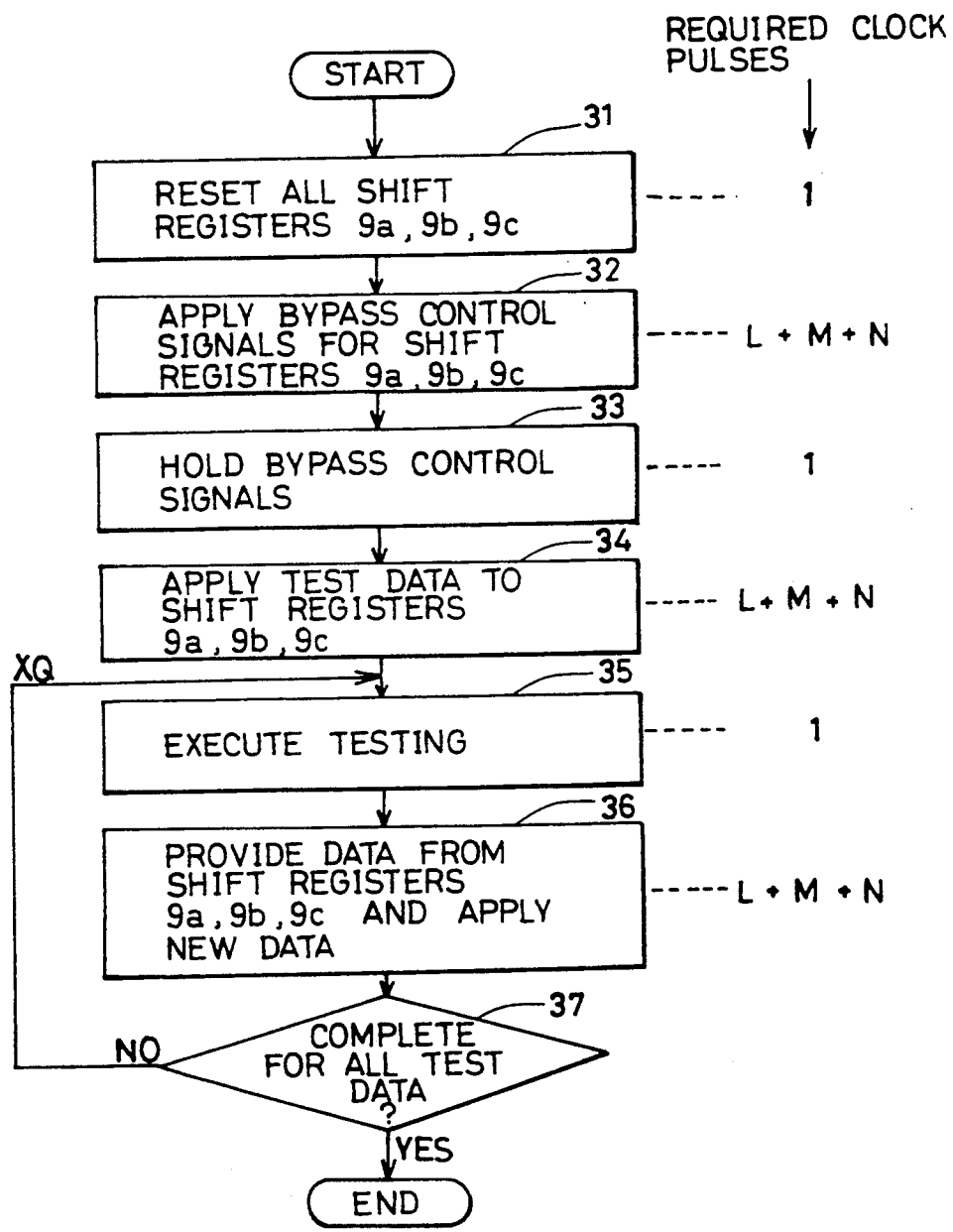
FIG. 5 is a flow chart of carrying out testing using the three shift path circuits of FIG. 1.

Three shift path circuits 10, 20 and 30 comprising the bypass circuit of FIG. 1 are shown in FIG. 4. Therein, switch 19 includes decoder 18 in combination with switching elements 15 and 16 as shown in FIG. 2. A flow chart is shown in FIG. 5 where testing is carried out using these three shift path circuits. The period of time required for testing will be explained hereinafter.

Referring to FIG. 5, at step 31, a reset signal RS is applied to the 3 shift path circuits 10, 20 and 30 to reset latch circuit 17 provided in each shift path circuit. This reset requires one clock pulse.

At step 32, a signal for controlling the bypass of shift registers in 3 shift path circuits 10, 20 and 30 is applied to each latch circuit 17. This provision of the bypass control signal is carried out in response to clock signal $\phi c$ via each of shift registers 9a-9b and 9c, requiring a clock pulse of $(L+M+N)$. At step 33, each latch circuit 17 responds to an externally applied holding signal CP to hold a bypass control signal. This holding operation requires one clock pulse.

At step 34, test data is applied to the 3 shift registers 9a, 9b and 9c connected in series. This requires a clock pulse of $(L+M+N)$.

At step 35, testing of the circuits-to-be-tested is carried out in accordance with the applied test data. It is assumed that this test execution requires one clock pulse. The data indicating the test result is held in any of shift registers 9a, 9b, and 9c.

At step 36, data held in shift registers 9a, 9b and 9c are provided in response to clock signal $\phi b$. At the same time, a new test data is applied to shift register 9a, 9b and 9c. This step requires $(L+M+N)$ clock pulses.

At step 37, determination is made whether testing has been carried out for all test data (test patterns). If test data remains, control returns to step 35 to repeat the testing operation of steps 35 and 36. In the case where Q test data are prepared, steps 35 and 36 will be repeated Q times. The total period of time required for testing all Q test data is expressed in the following equation.

$$TT2 = (L+M+N+1) \times (2+Q) \qquad (2)$$

By comparing equation (1) with equation (2), the difference in time $\Delta TT$ required for testing using 3 shift registers is expressed in the following equation.

$$\Delta TT = TT1 - TT2 = 9Q - 2(L+M+N+1) \qquad (3)$$

In general, the number of test patterns is greater in comparison with the bit length of the used shift registers. Accordingly, $\Delta TT > 0$. That is to say, the period of time required for carrying out testing is reduced by using the 3 scan paths 10, 20 and 30 of FIGS. 1 and 4.

For example, the bit length of each shift register is L, M, N=20, and 1,000 test patterns (Q) are prepared. By applying these values into equation (3), the following equation is obtained.

$$\Delta TT = 9,000 - 122 = 8,878 \qquad (4)$$

It is understood that the reduced period of time is equivalent to 8,878 clock pulses in this case.

Figure 6:
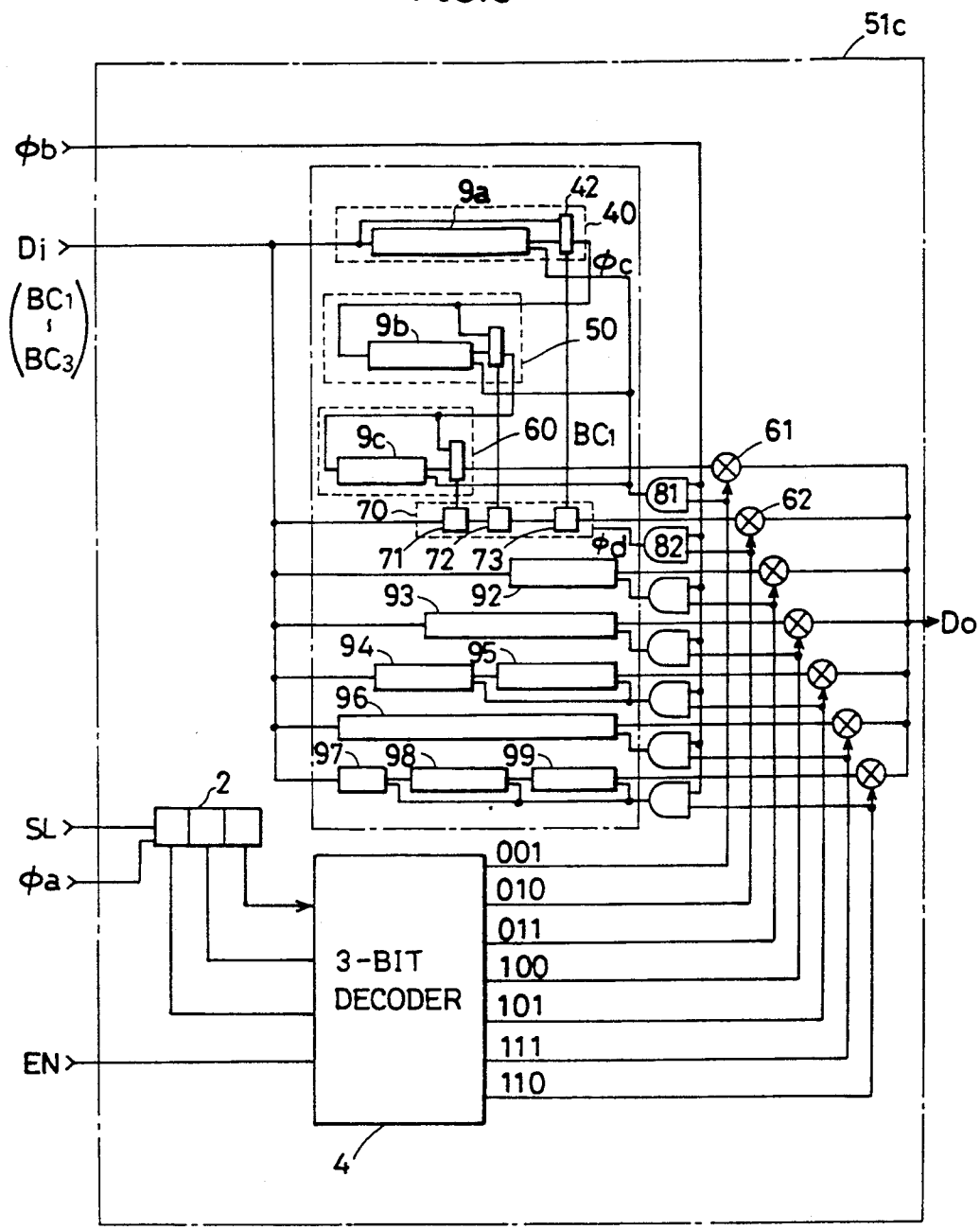
FIG. 6 is a circuit block diagram of an integrated circuit device of another embodiment of the present invention.

An integrated circuit device of another embodiment of the present invention is shown in FIG. 6. Referring to FIG. 6, a shift register 70 for holding a bypass control signal is provided instead of the shift register 91 of FIG. 1. Shift register 70 comprises 3 cascaded registers 71, 72 and 73. A bypass control signal for controlling the bypass of shift path circuits 40, 50 and 60 having bypass circuits is applied to shift register 70 as input data Di. Each of registers 71, 72 and 73 responds to a clock signal applied from AND gate 82 to shift the applied bypass control signal. The bypass control signal held in each of registers 71, 72 and 73 is applied to shift path circuits 40, 50 and 60. Each of shift path circuits 40, 50 and 60 include shift registers 9a, 9b and 9c.

Figure 3:
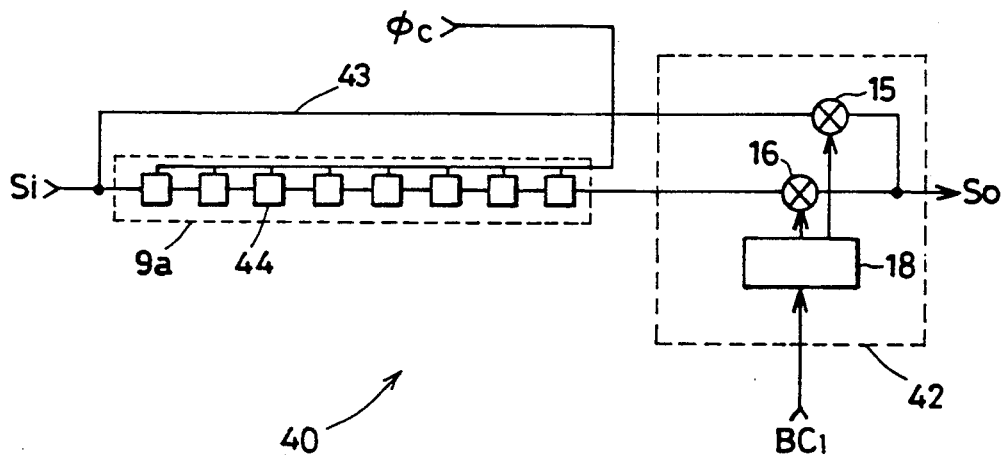
FIG. 3 is a block diagram of a shift path circuit of FIG. 6.

The shift path circuit 40 of FIG. 6 is shown in FIG. 3. Referring to FIG. 3, shift path circuit 40 comprises a shift register 9a operating in response to a clock signal $\phi c$ from AND gate 81, and a selecting circuit 42 operating in response to a bypass control signal BC1. In comparison with selecting circuit 12 of FIG. 2, selecting circuit 42 does not have latch circuit 17. Therefore, decoder 18 decodes bypass control signal BC1 provided from register 73 in shift register 70 to turn on either of switching elements 15 or 16. This results in the serial input signal Si provided as serial output signal So through either of shift register 9a or bypass line 43.

Figure 7:
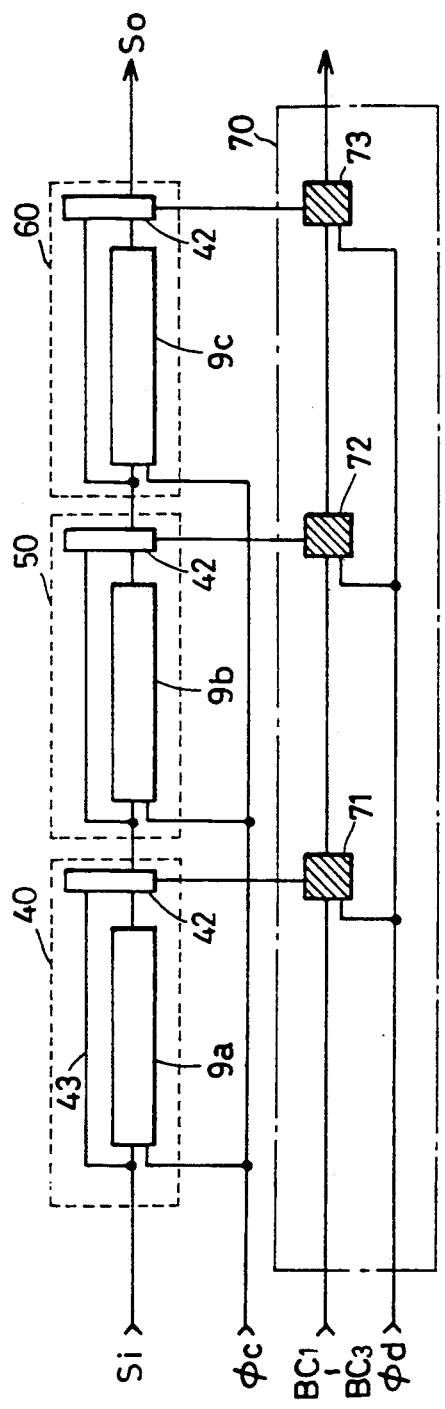
FIG. 7 is a circuit block diagram of the three shift path circuits and the bypass control signal holding shift register of FIG. 6.

The 3 shift path circuits 40, 50 and 60 of FIG. 6 are shown in FIG. 7. Referring to FIG. 7, each of shift path circuits 40, 50 and 60 comprises a similar circuit structure. Shift register 70 comprises 3 cascaded registers 71, 72 and 73. Each of registers 71, 72 and 73 responds to clock signal $\phi d$ provided from AND gate 82 of FIG. 6 to shift the applied bypass control signals BC1-BC3. When each bypass line within shift path circuits 40, 50 and 60 is used, each of registers 71, 72 and 73 holds bypass control signals BC3, BC2, and BC1, respectively, to provide that signal to the corresponding selecting circuit 42.

The operation of testing using the integrated circuit device of FIG. 6 is similar to that of the integrated circuit device of FIG. 1. The operation will be briefly described hereinafter. A selecting signal SL for selecting shift register 70 is applied to register 2. Decoder 4 decodes the signal held in register 2 to activate only AND gate 82 and switching element 62. Bypass control signals BC1-BC3 of 3 bits are applied to shift register 70. Each of registers 71, 72 and 73 in shift register 70 responds to a clock signal from AND gate 82 to hold a bypass control signal. For example, when bypass control signals (BC1, BC2, BC3)=(0, 1, 0), shift registers 9a and 9c are bypassed. The applied test data signal is therefore shifted within shift register 9b in response to a clock signal. There is another example where bypass control signal is (0, 1, 1). In this case, only shift register 9a is bypassed. Accordingly, the data signals held in shift registers 9b and 9c are provided via switching element 61.

It is pointed out that an effect similar to that shown in FIG. 1 is obtained also in the case where the shift path circuit of FIG. 6 is employed.

Figure 8:
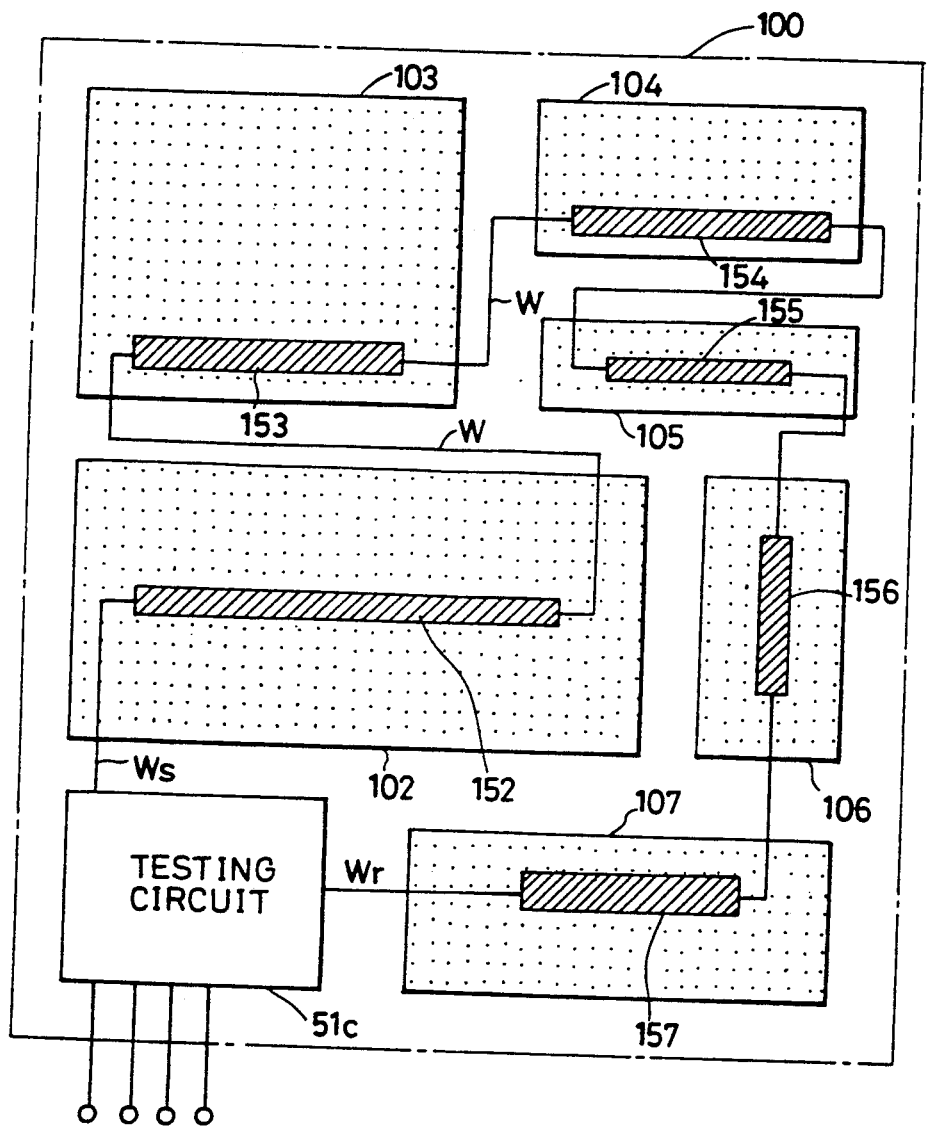
FIG. 8 is a schematic block diagram of an integrated circuit device employing the shift path circuits of FIGS. 2 and 3.
Figure 9:
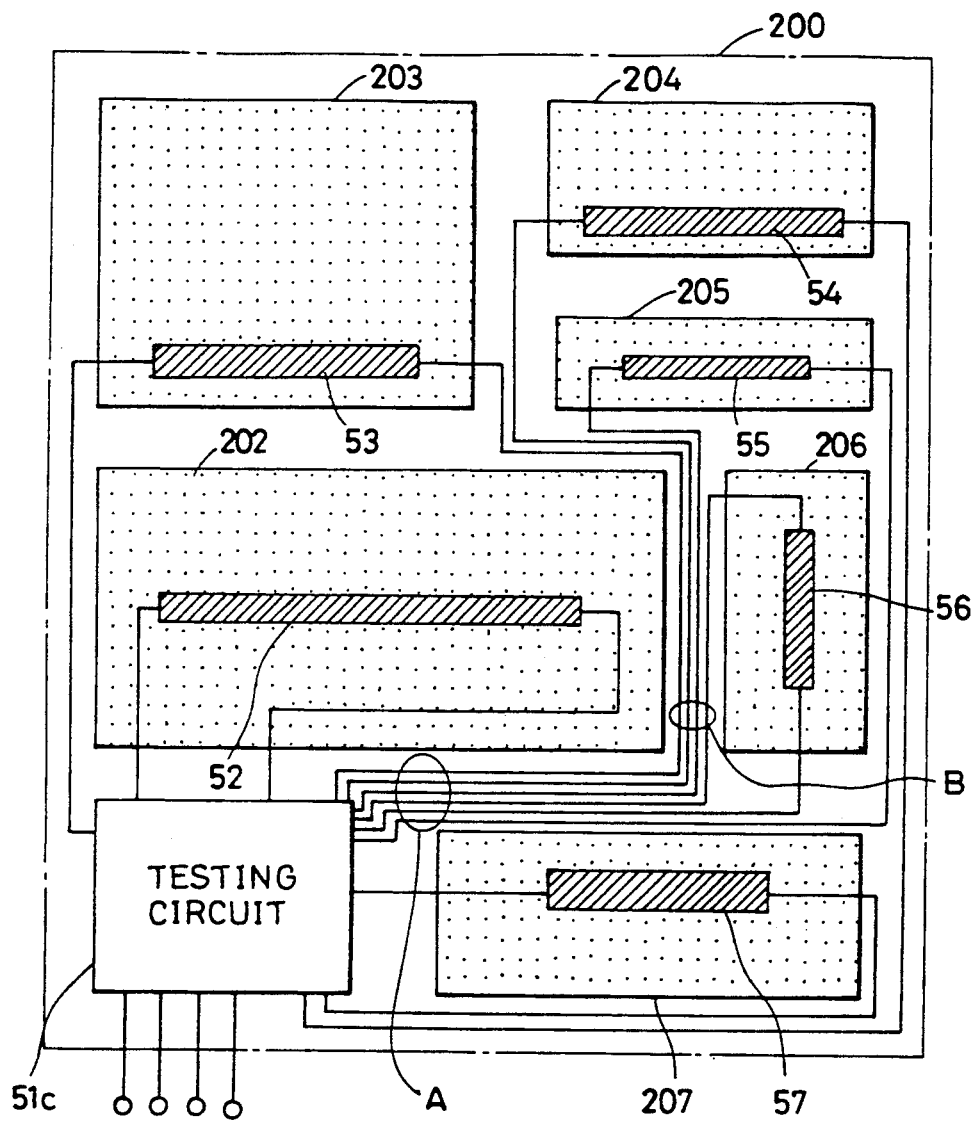
FIG. 9 is a schematic block diagram of an integrated circuit device employing a conventional scan path.

FIG. 8 shows an example where a scan path in an integrated circuit device is formed only by either of shift path circuits 10 or 40 of FIGS. 2 and 3. Referring to FIG. 8, each of scan paths 152-157 has a circuit structure similar to the shift path circuit having a bypass circuit shown in FIGS. 1 and 3. Each of scan paths 52-157 is provided within circuits-to-be-tested 102-107, respectively. One loop is formed with scan paths 152-157 and wiring W connected to each scan path. Testing circuit 51c provides a test data to a scan path via wiring Ws, and receives the test result from a scan path via wiring Wr. It is noted that the number of wiring is reduced in comparison with the conventional wiring shown in FIG. 9. This contributes to reduction in wiring region necessary for wiring information to increase integration density.

Figure 12:
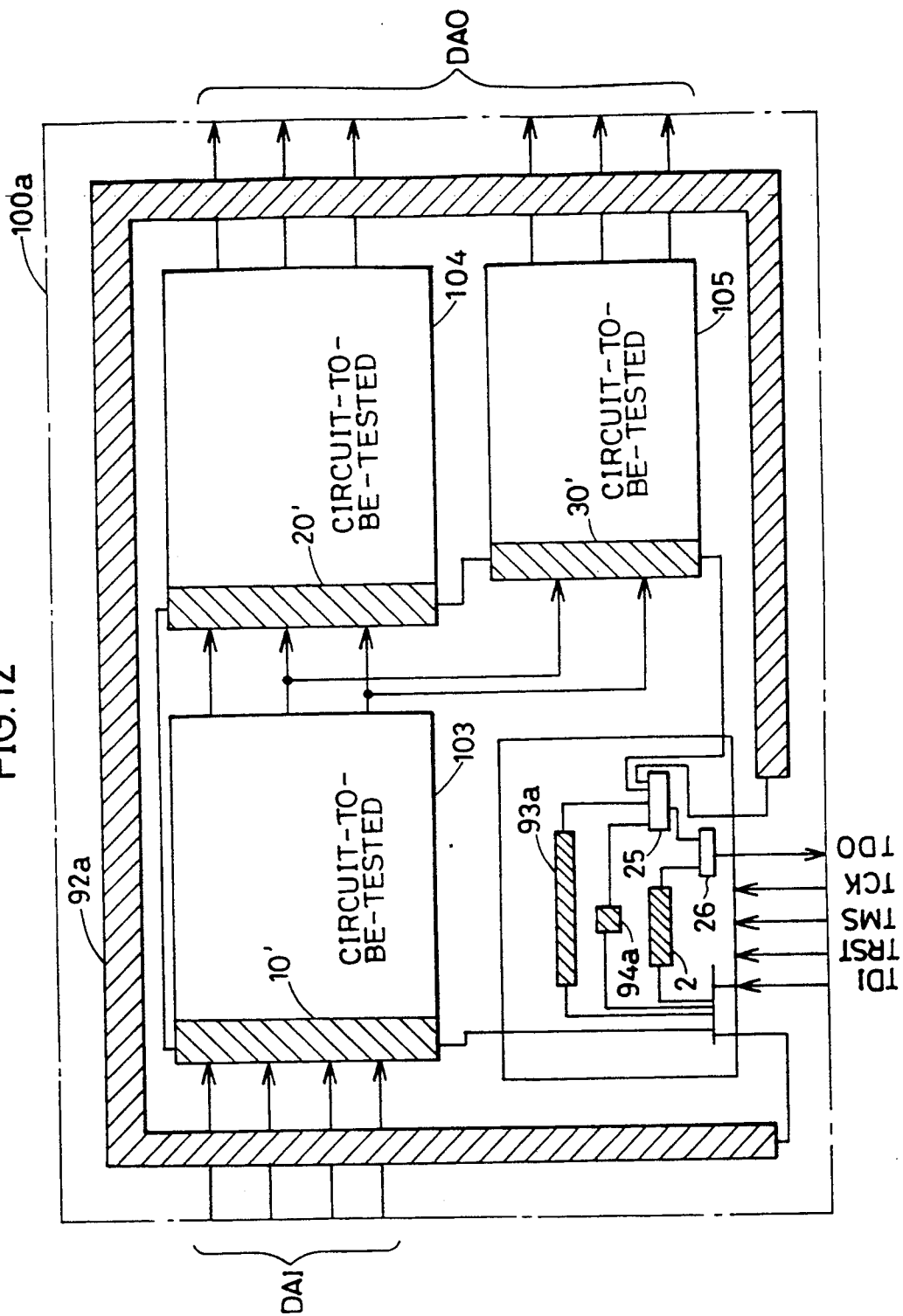
FIG. 12 is a block diagram of an integrated circuit device comprising a boundary-scan register showing a further embodiment of the present invention.

FIG. 12 is a block diagram of an integrated circuit device comprising a boundary scan register showing a still further embodiment of the present invention. Referring to FIG. 12, an integrated circuit device 100a comprises circuits-to-be-tested 103, 104 and 105 and a boundary scan register 92a provided in the periphery of integrated circuit device 100a. Shift path circuits 10', 20', and 30' are connected to the corresponding circuits-to-be-tested 103, 104, and 105. Shift path circuits 10', 20', and 30' each comprising a bypass circuit (not shown) are connected in series. Circuit-to-be-tested 103 receives an externally applied input data DAI via boundary scan register 92a and shift path circuit 10' in normal operation, and receives a shifted test data via shift path circuit 10' in testing operation. Circuit-to-be-tested 104 receives an output signal generated from circuit-to-be-tested 103 via shift path circuit 20' in normal operation, and a shifted test data from shift path circuit 20' in testing operation. Similarly, circuit-to-be-tested 30 receives an output signal generated from circuit-to-be-tested 103 in normal operation, and a shifted test data from shift path circuit 30' in testing operation. The output signals generated from circuits-to-be-tested 104 and 105 are provided as output data DAO via boundary scan register 92a.

Figure 13:
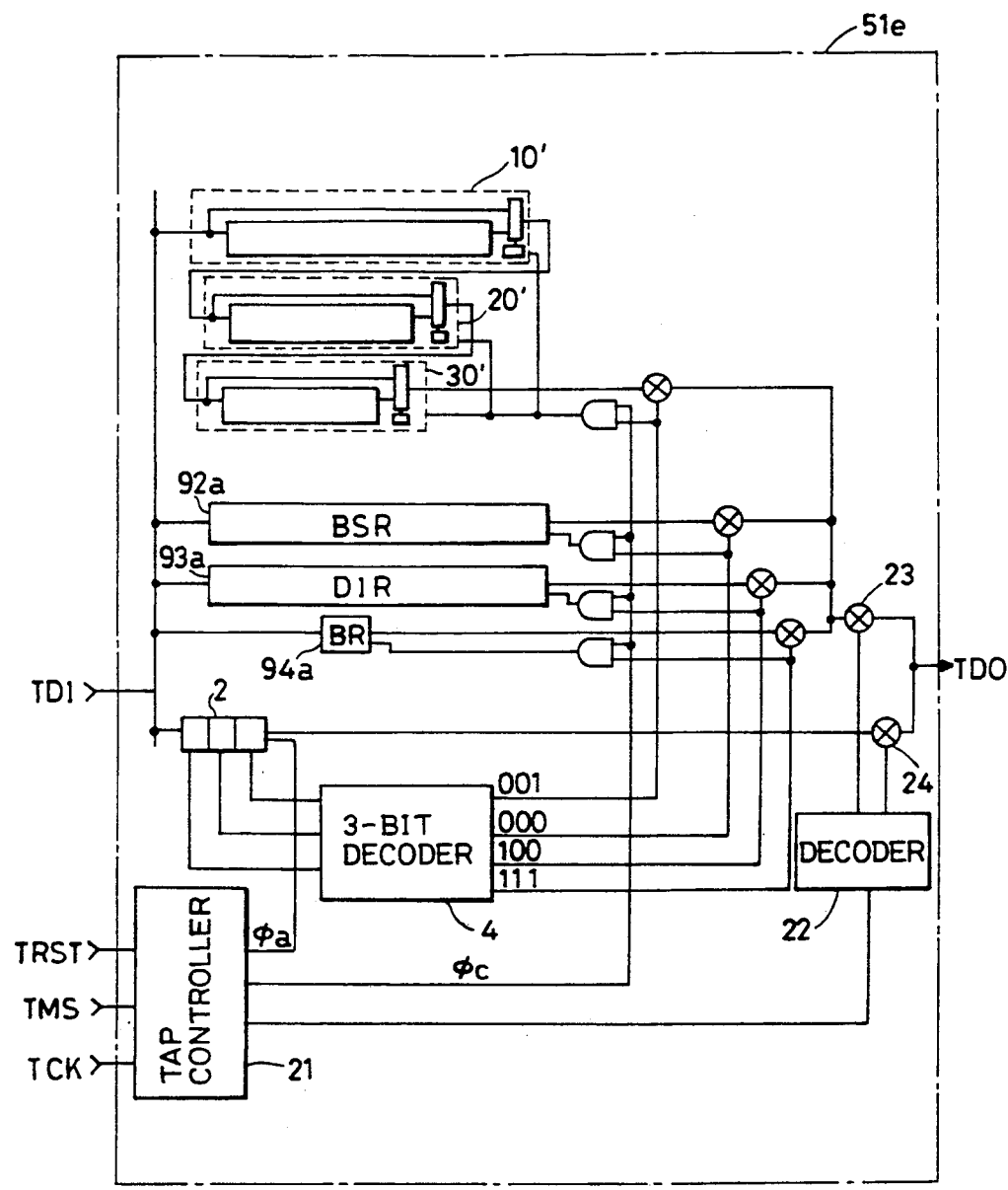
FIG. 13 is a circuit block diagram of a testing circuit of the integrated circuit device of FIG. 12.

FIG. 13 is a circuit block diagram of a testing circuit of the integrated circuit device of FIG. 12. Referring to FIG. 13, a testing circuit 51e comprises 3 shift path circuits 10', 20' and 30' each having a bypass circuit, a boundary scan register (BSR) 92a, a device identification register (DIR) 93a, a bypass register (BR) 94a, and a tap access port (TAP) controller 21. The 3 shift path circuits 10', 20' and 30' of FIG. 13 have circuit structures substantially similar to the shift path circuits 10, 20 and 30 shown in FIG. 1. It is appreciated that the advantages similar to the case of circuit 51c of FIG. 1 are obtained by using testing circuit 51e.

Boundary scan register 92a, device identification register 93a and bypass register 94a are respectively formed by a shift register basically. The details are disclosed in the aforementioned standard of IEEE (IEEE 1149.1). Briefly stated, boundary scan register 92a is used as a scan register for carrying out various board testings such as wiring connection test (EXTEST), LSI internal test (INTEST) and sample test (SAMPLE) in cases where LSIs are packaged on a printed circuit board. Boundary scan register 92a is therefore connected to the input/output terminals of each LSI.

Device identification register 93a is provided to store identification information of each LSI, i.e. ID codes, and is used to identify the faulty LSI in carrying out board test. By selectively providing shift clock pulse φc to device identification register 93a, the capture (Capture-DR) and shifting (Shift-DR) of the identification data are carried out. The ID code is obtained via test data output TDO.

Bypass register 94a is provided to transmit data applied to test data input TDI to test data output TDO in a short time. This generally takes a long period of time because the scan path length between test data input TDI and test data output TDO is extremely lengthy. When test operation is not carried out, bypass register 94a is selected to reduce the time period required for data transmission.

Register 2 is called an instruction register which holds and provides to decoder 4 instruction signals for controlling the selection and operation of the aforementioned shift registers.

Figure 18:
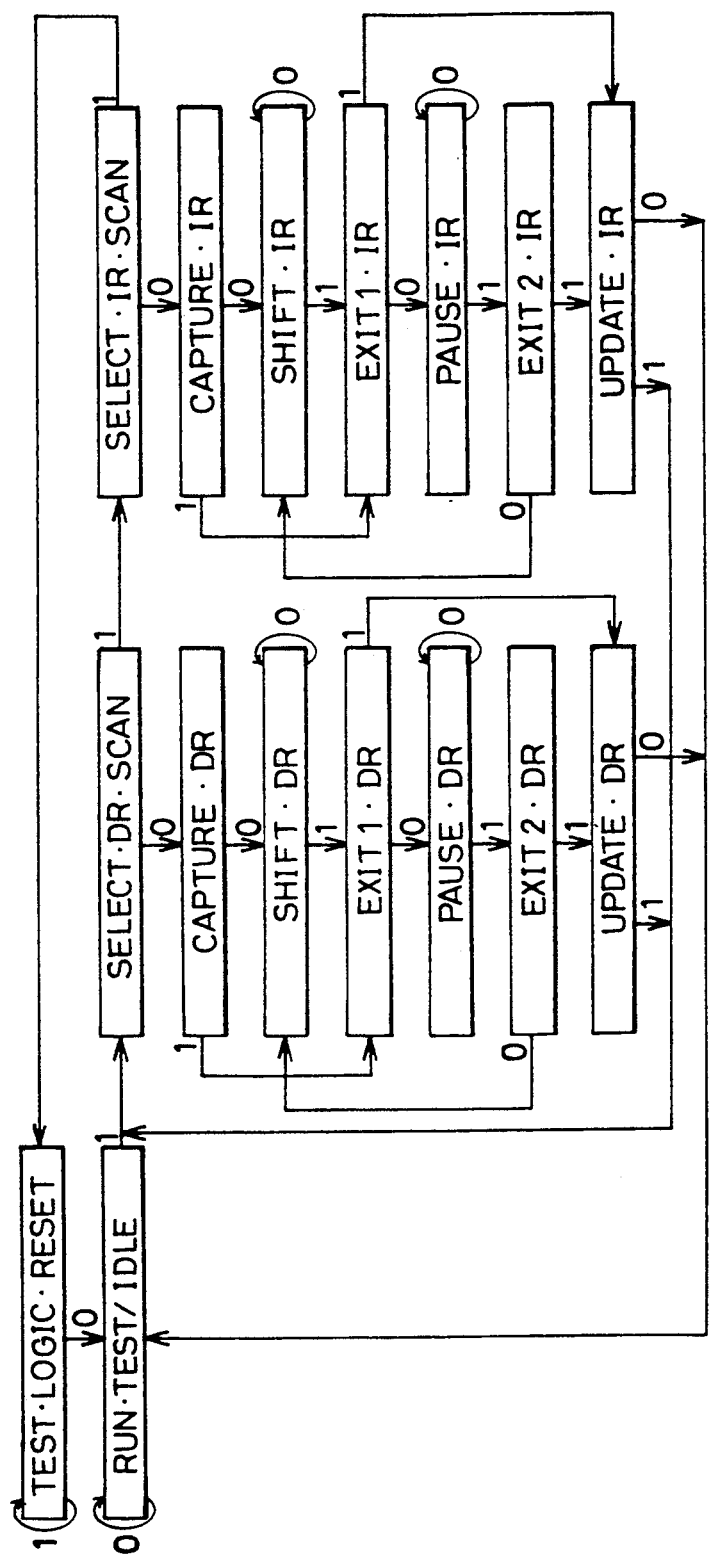
FIG. 18 is a state transition diagram of a TAP controller of FIG. 13.

TAP controller 21 is provided to control testing circuit 51e using a few test pins, i.e. 4 or 5 testing pins. TAP controller 21 is connected to receive test reset signal TRST, test mode selecting signal TMS and test clock signal TCK. TAP controller 21 selectively operates any of instruction register 2 or other shift registers 92a, 93a, 94a by providing one of shift clock pulses φa or φc. The operation control, that is to say, capture and application (update and transmission) of data of these registers are carried out also by TAP controller 21. A state transition diagram of TAP controller 21 is shown in FIG. 18.

Figure 16:
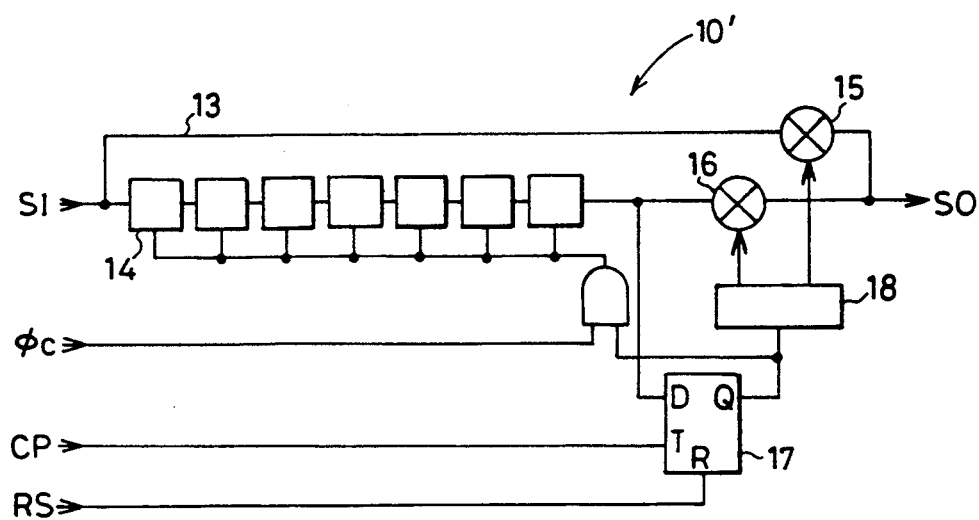
FIG. 16 is a circuit block diagram of a shift path circuit of FIG. 13.

Shift path circuits 10', 20' and 30' having a bypass circuit of FIG. 13 constitute a design definition test data register. A design definition test data register is provided for testing the internal circuits of a LSI. The shift path circuit 10' of FIG. 13 is shown in FIG. 16. The shift path circuit 10' of FIG. 16 operates in a manner similar to that of the circuit 10 of FIG. 2.

Figure 14:
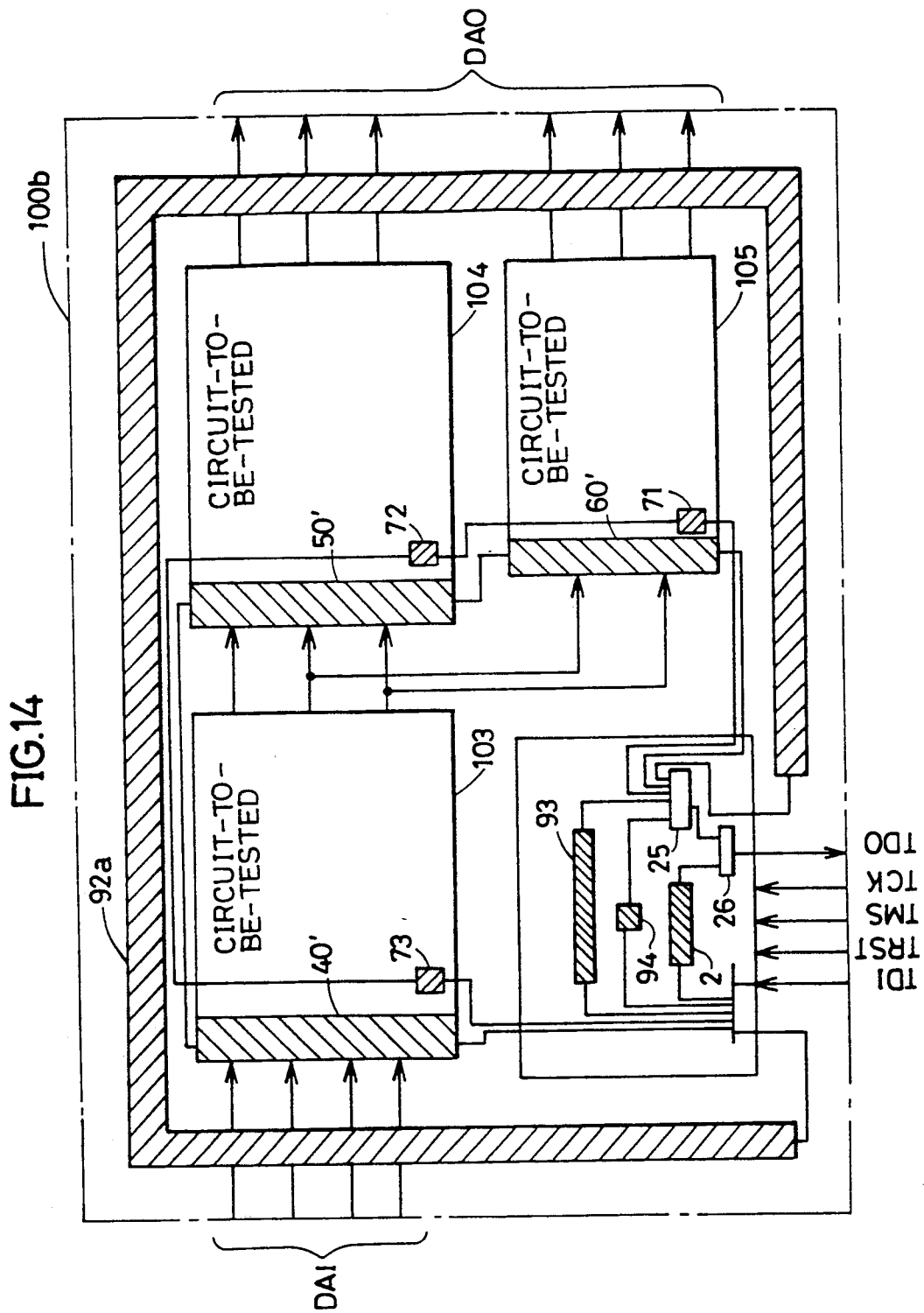
FIG. 14 is a block diagram of an integrated circuit device comprising a boundary-scan register showing a still further embodiment of the present invention.

FIG. 14 is a block diagram of an integrated circuit device comprising a boundary scan register of another embodiment of the present invention. In comparison with the circuit of FIG. 12, registers 71, 72 and 73 for controlling the bypass circuits are provided in addition to shift path circuits 40', 50' and 60'. The remaining circuit components are similar to those in integrated circuit device 100a of FIG. 12, and their description will not be repeated.

Figure 15:
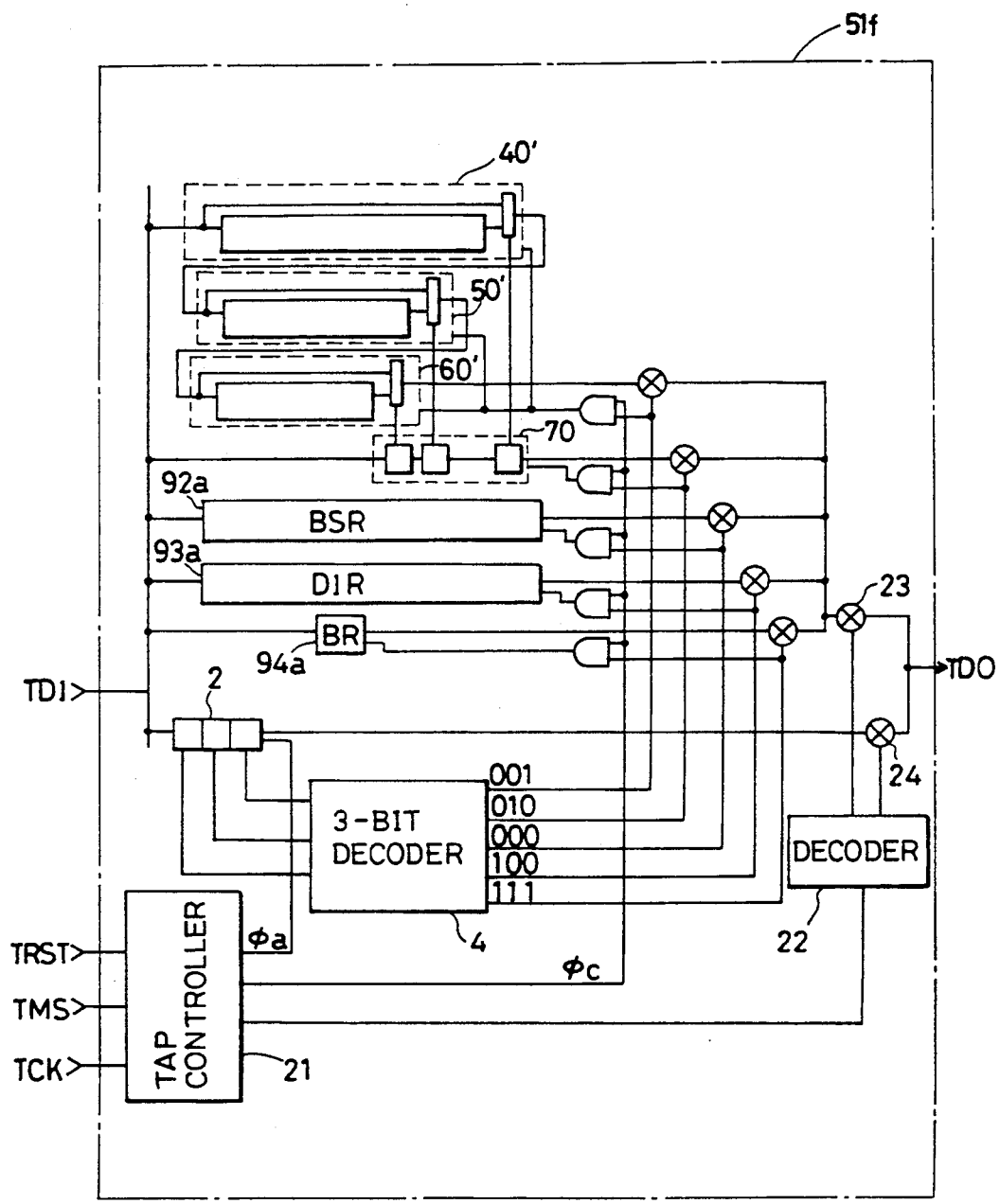
FIG. 15 is a circuit block diagram showing a testing circuit of the integrated circuit device of FIG. 14.
Figure 17:
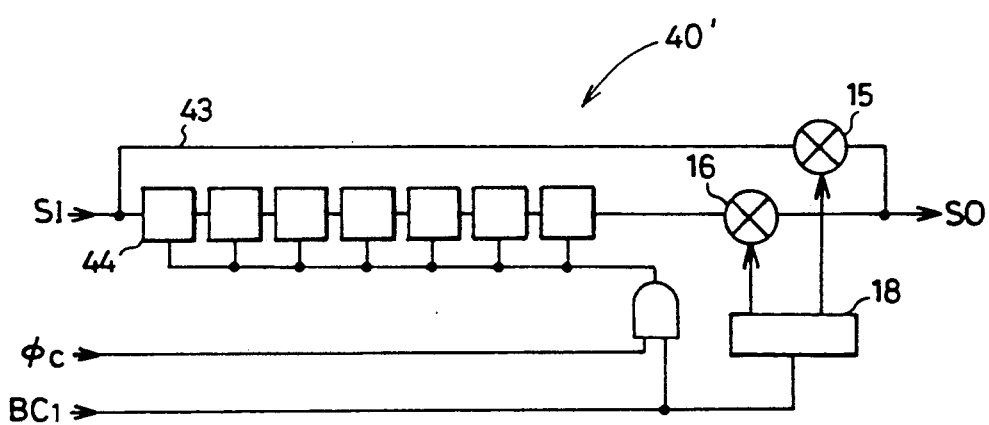
FIG. 17 is a circuit block diagram of a shift path circuit of FIG. 15.

FIG. 15 is a circuit block diagram of a testing circuit of the integrated circuit device of FIG. 14. Referring to FIG. 15, it is noted that registers 71, 72 and 73 for controlling the bypass circuit in each of shift path circuits 40, 50 and 60 are provided as shift register 70. The shift path circuit 40' of FIG. 15 is shown in FIG. 17. The remaining circuit components are similar to those in testing circuit 51e of FIG. 13, and the description will not be repeated.

It is possible to partially fix a testing circuit that can be used in common to various semiconductor integrated circuit devices by employing a shift path circuit having a bypass circuit as a scan path, as shown in FIGS. 1, 6, 13 and 15. Shift path circuits connected in series and each having a bypass are adapted suitably to test the circuit portions specific to individual semiconductor devices. Fixation of a circuit generally contributes to reducing the time period required for circuit design. The period of time required for carrying out testing is also reduced. Furthermore, the area occupied by wirings is reduced to allow circuits of high integration.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An integrated circuit device comprising:
   a data input node (TDI),
   a data output node (TDO),
   shift register means (92a) coupled between said data input node and said data output node,
   a plurality of circuits-to-be-tested (103–105),
   a series connected plurality of scan path circuit means (9a, 9b, 9c) for receiving input data from said input node, supplying said test input data to said circuits-to-be-tested, receiving test result data from said circuits-to-be-tested, and supplying said test result data to said data output node, wherein each of said plurality of scan path circuit means is connected to a corresponding circuit-to-be-tested of said plurality of circuits-to-be-tested,
   wherein (i) said series connected plurality of scan path circuit means and (ii) said shift register means are connected in parallel,
   selective enable means (2, 4, 61, 62, 81, 82) responsive to an externally applied selecting signal for selectively enabling each one of said serial connection of said plurality of scan path circuit means and said shift register means,
   a plurality of bypass means (13, 15, 16) each connected across a corresponding scan path circuit means of said series connected plurality of scan path circuit means for bypassing said corresponding scan path circuit means, and
   bypass control means (17, 18) responsive to an externally applied bypass control signal for selectively operating each of said plurality of bypass means.

2. The integrated circuit device according to claim 1, wherein said bypass control means comprises bypass control signal holding means (17, 70) for storing said externally applied bypass control signal,
   wherein said plurality of bypass means are selectively operated in response to the stored bypass control signal.

3. The integrated circuit device according to claim 2, wherein said bypass control signal holding means comprises bypass control signal latch means (17) connected to receive said externally applied bypass control signal via said plurality of scan path means in response to an externally applied holding request signal (CP) and to an externally applied holding request signal (RS).

4. The integrated circuit device according to claim 2, wherein said shift register means comprises bypass control signal shift register means (70) coupled between said data input and said data output nodes for holding said bypass control signal in response to said selective enable means.

5. The integrated circuit device according to claim 3, wherein
   said externally applied bypass control signal comprises a plurality of first individual bypass control signals for individually controlling said bypass means,
   said bypass control signal latch means comprises a plurality of latch circuits (17), each connected to receive one corresponding bypass control signal via said corresponding scan path circuit means, for latching said corresponding bypass control signal in response to said externally applied holding request signal.

6. The integrated circuit device according to claim 4, wherein
   said externally applied bypass control signal comprises a plurality of second individual bypass control signals for controlling individually said bypass means,
   said bypass control signal shift register means is responsive to said selective enable means for shifting and holding said plurality of second individual bypass control signals.

7. The integrated circuit device according to claim 1, wherein said selective enable means comprises:
   an instruction register (2) for storing said applied selecting signal,
   decoder means (4) for decoding said externally applied selecting signal,
   first switching means (62) connected between said shift register means and said data output node,
   second switching means (61) connected between said serial connection of said series connected plurality of scan path circuit means and said data output node,
   wherein said first and second switching means are responsive to an output signal generated from said decoder means to be selectively turned on, alternatively connecting said first shift register means and said scan path circuit means to said data output node, and
   selective shift clock applying means (81, 82) connected to receive an externally applied shift clock pulse for selectively applying said shift clock pulse to one of said serial connection of said plurality of shift path circuit means and said shift register means in response to said output signal generated from said decoder means.

8. The integrated circuit device according to claim 1, wherein each of said bypass means comprises:
   a bypass line (13) having one end connected to an input node of said corresponding scan path circuit means,
   third switching means (15) connected to the other end of said bypass line, and
   fourth switching means (16) connected to a first output node of said corresponding scan path circuit means,
   wherein said bypass control means is responsive to said bypass control signal for selectively turning on said third and fourth switching means to alternatively connect said bypass line and said output node of said corresponding scan path circuit means to a corresponding second scan path circuit data output node.

9. The integrated circuit device according to claim 1, wherein said shift register means comprises a boundary scan register (92a), a device identification register (93a) and a bypass register (94a).

10. The integrated circuit device according to claim 1 wherein said data input node comprises a single test data input terminal (TDI) for receiving said test data to test said plurality of circuits-to-be-tested, and said data output node comprises a single test data output terminal (TDO) for providing the test result data generated from said plurality of circuits-to-be-tested.

11. An integrated circuit device having a test mode of operation responsive to an externally applied test input data, comprising:

a test data input node (Di) for receiving said test data, a test data output node (Do) for providing test result data, first and second circuit-to-be-tested blocks, each to be tested, first scan path circuit means (91) connected to said first circuit-to-be-tested block for writing said test input data to or reading said test result data from said first circuit-to-be-tested block, second scan path circuit means (10, 20, 30) for writing said test input data to or reading said test result data from said second circuit-to-be-tested block, wherein said first and second scan path circuit means are connected in parallel between said test data input node and test data output node, selective enable means (2, 4, 61-67, 81-87) responsive to an externally applied selecting signal for selectively enabling one of said first and second scan path circuit means, wherein said second scan path circuit means comprises n (n≧2) shift register means (9a, 9b, 9c) cascaded into n stages and connected between said test data input node and said test data output node, said n cascaded shift register means writing test input data to or reading test result data from said second circuit-to-be-tested block, n bypass means (13) each connected between the input and output of one corresponding shift register means, and constituting a bypass for said corresponding shift register means, and bypass control means (12) responsive to an externally applied bypass control signal for selectively operating each of said n bypass means.

12. A semiconductor integrated circuit comprising:

a data input terminal (TDI), a data output terminal (TDO), a plurality of registers including a boundary scan register (92a), a device identification register (93a), a bypass register (94a), an instruction register (2) and a design definition test data register (10', 20', 30'), each connected in parallel between said data input terminal and said data output terminal, a plurality of circuits-to-be-tested (103-105), and selecting means (4, 61, 62, 81, 82) responsive to an externally applied selecting signal for selecting one of said plurality of registers, wherein said registers are responsive to said selecting means to be electrically connected to said data input terminal or data output terminal, wherein said design definition test data register comprises a series connected plurality of scan path circuits (9a, 9b, 9c) each connected to a corresponding circuit-to-be-tested of said plurality of circuits to-be-tested for forming a scan path for said corresponding circuit-to-be-tested, a plurality of bypass circuits (13, 15, 16) each connected across one corresponding scan path circuit of said plurality of scan path circuits and responsive to an internal bypass control signal for bypassing said corresponding scan path circuit, and a bypass control circuit (17, 18) responsive to an externally applied bypass control signal for providing said internal bypass control signal for selectively operating said plurality of bypass circuits.

* * * * *

UNITED STATES PATENT AND TRADEMARK OFFICE
CERTIFICATE OF CORRECTION

PATENT NO. : 5,150,044

DATED : September 22, 1992

INVENTOR(S) : Hashizume et al

It is certified that error appears in the above-identified patent and that said Letters Patent is hereby corrected as shown below:

Column 11, line 60, "request" should be --reset--

Signed and Sealed this

Twenty-sixth Day of October, 1993

Attest:

BRUCE LEHMAN

Attesting Officer

Commissioner of Patents and Trademarks